United States Patent [19]

Kulynych et al.

[11] 4,349,583
[45] Sep. 14, 1982

[54] LASER ENHANCED MASKLESS METHOD FOR PLATING AND SIMULTANEOUS PLATING AND ETCHING OF PATTERNS

[75] Inventors: Larysa H. Kulynych, Rochester; Lubomyr T. Romankiw, Briarcliff Manor; Robert J. von Gutfeld, New York, all of N.Y.

[73] Assignee: International Business Machines Corporation, Armonk, N.Y.

[21] Appl. No.: 287,661

[22] Filed: Jul. 28, 1981

[51] Int. Cl.³ .............................................. B05D 3/06
[52] U.S. Cl. ........................... 427/53.1; 204/157.1 R; 427/287; 427/436
[58] Field of Search ...................... 427/53.1, 287, 435, 427/436; 204/157.1 L

[56] References Cited

U.S. PATENT DOCUMENTS

| | | | |
|---|---|---|---|
| 3,530,053 | 9/1970 | Scott et al. | 427/53.1 |
| 4,221,832 | 9/1980 | Philippe et al. | 427/436 |
| 4,239,789 | 12/1980 | Blum et al. | 427/53.1 |
| 4,242,369 | 12/1980 | Mansukhani | 427/287 |
| 4,264,421 | 4/1981 | Bard | 427/53.1 |
| 4,272,570 | 6/1981 | Narayan | 427/436 |

*Primary Examiner*—John H. Newsome
*Attorney, Agent, or Firm*—Graham S. Jones, II

[57] ABSTRACT

A method for high resolution maskless plating with an immersion, exchange or like plating bath is described. Preferential plating results from exposing those regions where plating is sought to an energy beam to increase the plating rate and the resulting plating thickness is several orders of magnitude greater than is possible by standard immersion techniques.

9 Claims, 8 Drawing Figures

LASER ENHANCED MASKLESS METHOD FOR PLATING AND SIMULTANEOUS PLATING AND ETCHING OF PATTERNS

DESCRIPTION

Technical Field

This invention relates generally to a method for enhancing the rate of immersion, exchange or like plating, and more particularly to a technique which employs an energy beam to enhance the plating rate.

Commonly assigned applications Ser. Nos. 037,073 now U.S. Pat. No. 4,239,789, 037,075 and 037,074 all of which were filed May 8, 1979, respectively treat methods for maskless electroless plating of patterns, locally enhancing the rate of electroplating, and for locally enhancing the rate of chemical and electrochemical machining.

Background Art

It is possible to produce very thin film patterns (1000–3000 Å thick, at most) by immersion or exchange plating techniques. Masking is employed to delineate the patterns. These plating processes produce extremely thin films. Also, it is necessary to employ a photoresist, the surface of which is exposed selectively to form a mask. The surface is plated and finally the mask is stripped away. This is a multistep process.

Rain et al., U.S. Pat. No. 4,024,029 for "Electrodeposition" describes a process in which light produces a photovoltaic effect which promotes plating. (See col. 9, lines 50–57.) Plating is referred to in the patent at different places as electroplating. (Col. 9, line 25 and claim 1.) In the alternative, at col. 5, line 62, it is indicated that "Plating continues on an exchange basis exposed substrate going into solution in exchange for metal deposited." In FIG. 3 a 60 watt incandescent lamp 76 is used to illuminate the surface to be plated. In FIG. 4 a tungsten lamp 100 generates free charge carriers from the semiconductor layers causing a current to flow in the electrolyte.

Japanese Pat. No. 50-92830 teaches a method of photoplating by shining a $CO_2$ laser beam with a 30 watt intensity onto a gold plating solution of $HAuCl_4$. There is no indication in the language translation that heat is produced in the GaAs sample. There is no teaching that the plating rate is a function of power density nor that the phenomenon would occur for a non-photoconducting substrate.

Scott et al. in U.S. Pat. No. 3,530,053 teach exposing the plating solution to a high intensity light source to enhance the plating rate. While this technique increases the plating rate, it is not well suited for preferentially plating patterns since there will be mixing of the activated solution with the nonactivated solution. The mixing will reduce the resolution of any resulting pattern.

G. Suzuki and P. Tomoski in U.S. Pat. No. 3,935,117 teach a method for selectively etching patterns by employing a photosensitive compound which is applied to the surface to be etched. When dry, the compound is irradiated with ultra-violet radiation which activates the solution and produces etching. It should be noted that both the Scott et al. and the Suzuki et al. patents are limited with respect to the materials that may be employed, since the etch and compounds must be photosensitive. Furthermore, the Suzuki et al patent places a second restriction on the material; it must dry to form a layer coating the surface which may then be activated.

J. Polichette et al. in U.S. Pat. No. 3,993,802 teach electrolessly coating the surface to be plated with a sensitizing solution. The coated surface is exposed to light to form a catalytic layer capable of directly catalyzing the deposition of metal thereon from an electroless metal deposition solution. Again, this technique suffers from the limitation of being a multistep process and requires a light activated catalytic layer. The instant invention does not employ a catalyzing agent.

An object of the present invention is to establish a method for maskless plating.

Another object of the invention is to provide a method for plating which is suitable for personalization of integrated circuits.

A further object of this invention is to provide a method for selectively varying the plating rate to allow local adjustments in the plating thickness and provide a more wear resistant surface.

Various other objects and advantages of the present invention will become apparent to those skilled in the art from the following description and suggested industrial applications.

Another object of this invention is to plate lines upon a thin metal film while concomitantly removing the thin metal film along the periphery of the film being plated to provide a separate conductor line or the like.

A further object of this invention is to provide thick film deposits when plating in the absence of reducing agents and external plating potentials using exchange or immersion plating solutions and like solutions.

The practice of the present invention allows one to plate a pattern on a surface of a workpiece without masking. The surface to be plated is contacted with a plating solution. An energy beam is directed onto the workpiece to locally heat the surface and to promote enhanced plating.

The above cited commonly assigned applications show means for electroplating and electrolessly plating by a laser enhancement technique. In electroplating, the current is supplied externally by some form of power supply. In electroless deposition, no external current is supplied but local charge transfer occurs by a discharge of ions at the workpiece-electrolyte interface. This is activated by decomposition of a reducing agent intentionally added to the plating solution, at catalytic sites. None of the substrate material onto which the plating occurs dissolves in the electroless plating process, as contrasted with the instant invention.

Plating Without An External Power Source

A number of laser enhanced plating effects requiring no external power source have been investigated heretofore.

The first of these is laser enhanced electroless nickel plating using sodium hypophosphate as a reducing agent in connection with $PdCl_2$ surface activation or an electrically activated metallic film surface deposited on glass substrates. [R. J. von Gutfeld, E. E. Tynan and L. T. Romankiw, "Laser Enhanced Electroplating and Etching for Maskless Pattern Generation," Extended Abstract No. 472, Electrochemical Soc. 79-2 (1979).]

Enhanced electroless nickel plating in the region of laser irradiation occurred but at a slower rate compared to laser enhanced nickel electroplating. Almost no background plating was observed. Since no external current flows in these systems, the laser enhanced growth rates are determined by comparing the thickness of the laser exposed and the non-laser exposed regions. The experimental arrangement consisted simply of the sample submerged in a glass container containing the Ni electroless plating solution and shining a focused CW argon laser beam into the solution onto the sample.

The lack of significant background plating and slower plating rates in electroless plating are readily explained in terms of the well known facts that: (1) The electroless plating solutions are usually formulated to produce no catalytic chemical reaction (no plating) at room temperature and plating at measurable but controlled rates at elevated temperatures (on the order of 60° to 95° C.). (2) The plating rate of a typical electroless solution is strongly temperature dependent and this temperature dependence closely corresponds to the difference between $\Delta F.°_{25° C.}$ and $\Delta F.°_{25° C. + \Delta T}$ for the overall chemical reaction, hence to the shift in the equilibrium constant between the 25° C. and the plating temperature (25° C. + $\Delta T$). Here $\Delta F.°$ is the free energy difference between the surface and the solution. (3) The plating rate for the typical well formulated electroless plating solution is primarily discharge controlled and the mass transport usually does not affect the rate.

Exchange Plating

In a typical exchange plating process, a surface of a less noble element is immersed in a solution containing a more noble element. The surface is covered with a plurality of cathodic and anodic regions consisting of crystallite and intergranular regions. Due to the heterogeneous nature of the surface (i.e., $\Delta F.°_{grain}$ is less than $\Delta F.°_{intergranular\ regions}$) local electrochemical cells are set up in which the less noble element leaves the electrons behind at the anodic regions and goes into solution and the more noble metal ions present in solution deposit at the cathodic (more noble regions) where they acquire the electrons released by the dissolution of the less noble element. This process continues until it is self-terminated due to shrinkage and nearly complete closing of the pores in the anodic regions. The exchange process takes place uniformly over the entire surface of the submerged substrate. The driving force for the process is the local variation of the thermodynamic potential of the surface, i.e., between grain boundary and grains, dislocations and grains, etc. Hence, anodic and cathodic regions are established on a microscale. The process is self-limiting by total coverage of the entire submerged surface. Usually the thicknesses of the plated films produced are on the order of a few thousand angstroms, which is inadequate for some practical applications.

Disclosure of Invention

In accordance with this invention, exchange plating, referred to by some as a form of electroless plating, is enhanced by focusing a laser on the regions where preferential plating is sought.

In accordance with this invention a method is provided for selectively plating onto a surface of a workpiece without application of an electrical potential source comprising the steps of:

contacting the surface with a plating solution in the absence of a reducing agent and without application of an electrical potential source, and directing an energy beam onto the workpiece to locally heat the surface to promote plating.

Preferably the beam is laser generated, the beam having an intensity between about $10^2$ W/cm$^2$ and $10^6$ W/cm$^2$. Preferably the beam is modulated.

The workpiece can be a composite structure having a thermally insulating substrate and a film which is strongly absorbent of the energy of the beam. Preferably the substrate is transparent to the beam which passes through the substrate and impinges on an interface between the substrate and the film; and for which the film preferably has a thickness no greater than the minimum dimension of the pattern to be plated.

This invention contemplates preferentially plating regions of a surface employing a non-photo decomposable plating solution without a reducing agent, the improvement comprising: directing a light beam onto the region of the surface to heat the surface locally where preferential plating is sought, the beam having an intensity of at least $10^2$ W/cm$^2$.

Preferably the method of this invention includes plating into through and via holes, and onto corners and edges in a workpiece. Simultaneous plating onto areas heated by the energy beam and etching along the periphery of the areas heated by the energy beam is provided.

BRIEF DESCRIPTION OF THE PREFERRED EMBODIMENT

Figure 1:
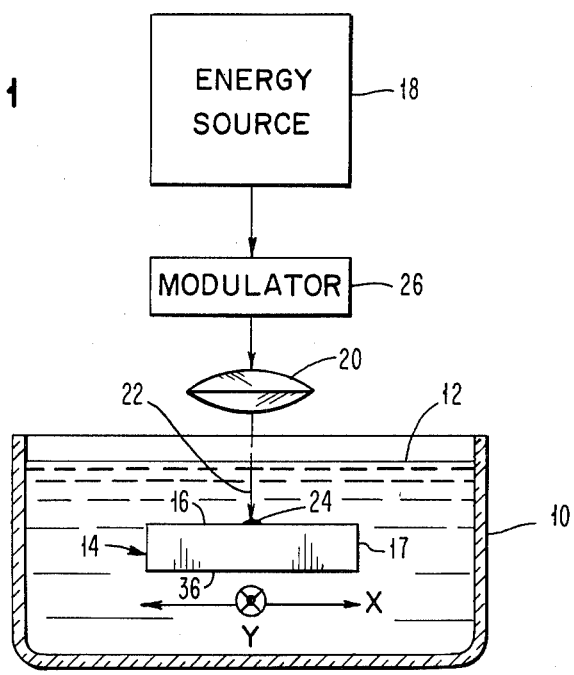
FIG. 1 shows a schematic of an energy source directed through a modulator and a lens at a workpiece located in the container holding an exchange or immersion plating bath.

We have discovered that if a laser beam or its energy equivalent is focused onto the substrate, the exchange rate can be localized and enhanced in the area heated by the laser beam. Furthermore, the area immediately adjacent to the heated area is etched. When the substrate comprises an insulator carrying a thin metallic film, dissolution of the metal immediately adjacent to the enhanced plated region isolates the enhanced plated regions electrically.

A focused laser (power density for several seconds duration of the order of $10^4$ W/cm$^2$) is directed onto a cathode (substrate) of a less noble metal than the electrolyte. The substrate metal can be selected from W, Mo, Cu, Ni, Co, Fe, Al and the like. In most cases, we have studied employing the laser for an exchange reaction which causes the illuminated spot to become a cathode. The remaining surface becomes an anode. In some cases the reverse occurs. More noble metal ions from the electrolyte are deposited on the cathode (area illuminated by the laser), while simultaneous etching occurs in the anodic region surrounding the plated area. This permits at least two orders of magnitude faster exchange plating rates and at the same time permits a buildup of metal at least an order of magnitude thicker than would occur without the laser. This effect has been demonstrated with the deposition of copper onto nickel, gold onto tungsten, gold onto nickel, gold onto copper and palladium onto copper. For deposition of copper onto a nickel film (500 Å thick), spots and lines of several microns in thickness and on the order of 100-200 microns in width have been demonstrated.

In general the exchange plating process is quite temperature dependent with increased exchange plating rates occurring with higher temperatures. This process, like electroless plating, depends primarily on the shift in the equilibrium constant due to differences between $\Delta F.°_{25°\ C.}$ and $\Delta F.°_{25°\ C.+\Delta T}$ for the overall reaction. In most cases for well formulated solutions the rate is primarily under chemical kinetic control. Unlike electroless plating, where the driving force is a reducing agent present in the solution, the driving force here is due to the local differences in the free energy, $\Delta F.°$, of the substrate, due to the heterogeneous nature of the substrate (i.e., differences in $\Delta F.°$ caused by intergranular regions v.s. $\Delta F.°$ of the surface of crystallites). Under normal exchange plating conditions the total surface of the metal in an immersion plating solution becomes covered by a large number of anodic and cathodic regions on a microscale (grain size level) and the local electrochemical reaction proceeds in each individual microcell until the total surface of the metal is covered with a uniformly thick porous deposit of the more noble metal.

By locally heating the surface with a laser beam we have demonstrated that it is possible to establish a ($\Delta F.°_{25°\ C.} - \Delta F.°_{25°\ C.+\Delta T}$) difference which is greater than the ($\Delta F.°_{25°\ C.}$ grain $- \overline{\Delta F.°}_{25°\ C.}$ intergranular regions) and hence have made the part of the surface held at room temperature act (in most cases) as an anode while the laser illuminated area (heated area) acts as a cathode, thus establishing a thermobattery effect. This effect was demonstrated by us, not only for the exchange plating where the solution contains the more noble element while the surface being plated consists of a less noble metal, but even for a case where both the substrate metal and the element in solution are of the same nobility, i.e., a copper substrate immersed in a copper sulfate solution. In this case, the difference in free energy is strictly based on the difference in temperature of two different regions (thermobattery effect). Depending on the direction in which the equilibrium potential shifts, either local plating or etching will take place. One interesting aspect of laser enhanced exchange plating is that it should permit plating of a less noble metal onto a more noble metal surface when the temperature shift in equilibrium potential of the less noble metal is such that it becomes more positive than the cooler, more noble metal, not irradiated.

BEST MODE FOR CARRYING OUT THE INVENTION

The practice of the energy beam assisted immersion or exchange plating will be described in terms of FIG. 1. There is shown in FIG. 1 a vessel 10 which contains an immersion or exchange plating solution 12 including a relatively noble metal ion to be plated such as copper or gold. The workpiece 14 is immersed in the plating solution 12 so as to cause the surface 16, where plating is desired, to be contacted by the plating solution 12. Surface 16 is composed of a relatively less noble metal such as Cr, Ti, W, Ni, Cu, Al, Co, and their alloys, etc. The ions from the solution 12 will plate directly on surface 16 by immersion or exchange plating at a relatively slow rate when the part is held at a uniform temperature achieving only a thin film.

While the workpiece 14 has been illustrated with the plated surface 16 being a horizontal flat surface, any surface orientation or contour contactable with the solution and subject to the beam's energy can be employed. This would include the surfaces with holes, crevices, and protrusions, etc.

When the workpiece 14 is submerged in the solution 12 plating will occur at a nominal or background rate on all exposed faces including the surface 16. With properly formulated solutions, this background rate can be made to approach zero at room temperature. An energy source 18 is focused by a lens system 20 to concentrate the energy and form a beam 22 which passes through the plating solution 12 and impinges on the surface 16.

An energy source 18 which generates electromagnetic radiation in the visible or infrared spectrum is particularly useful since a wavelength can be selected which is not strongly absorbed by the workpiece 14. When it is desired to plate high resolution patterns with front surface illumination, it is most efficiently achieved by having a workpiece 14 of very low thermal conductivity, i.e. a thermal insulator, thereby preventing thermal spread. However, bulk copper, stainless steel and nickel have also been locally plated by this method.

Figure 2:
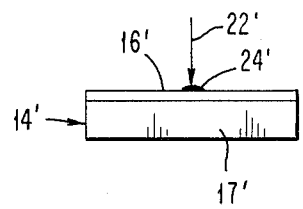
FIG. 2 shows a composite workpiece with a substrate such as a transparent insulator carrying a thin film of a metallic, light absorbing material.

This technique of energy beam enhanced exchange plating is well suited for a composite workpiece 14' (FIG. 2) in which the plated surface 16' is strongly optically absorbing (a material such as a metal), and the substrate 17' is a material with a low thermal conductivity such as glass. This configuration of the workpiece 14' is illustrated in FIG. 2. This composite structure will further enhance the localization of the heat and thereby increase the preferential plating in the heated regions. The beam 22' exposes the region 24' locally heating that portion of the surface 16' where plating is sought.

A pattern 24 can be generated by moving the beam or the workpiece 14 in the x and the y directions. (FIG. 1)

When electromagnetic radiation in the visible range is employed it can be generated from a carbon arc but a laser is preferred. The laser provides a high intensity energy source 18 which may eliminate the necessity of a lens system 20 unless further focusing is desired to reduce the size of the beam 22. The light beam 22 would have an intensity preferably between about $10^2$ to $10^6$ W/cm$^2$. The exact power density depends on the thermal properties of the workpiece, the duration of the exposure and the desired plating thickness.

The lower limit is required to provide sufficient heating for enhancement of the plating rate, while the upper limit should be chosen to avoid thermotransformation of the structure of the workpiece 14. For most practical applications, this will limit the maximum power input to about $10^6$ W/cm$^2$.

When a beam 22 passes through the etching solution 12 care must be taken in selecting the wavelength of the light to avoid a wavelength that is strongly absorbed by the etching solution 12. It should be pointed out that this teaches away from the method of Scott et al. Alternative plating arrangements are available where the beam 22 need not pass through the plating solution 12. If, for example, only the surface 16 of the workpiece 14 is brought in contact with the plating solution 12, the beam 22 may expose the workpiece 14 on the side opposite from the plated surface 16. As workpiece 14 is not transparent to the energy beam then for best plating resolution, finite thermal conductivity is required to transport the heat from surface 36 to the front surface 16 where plating is desired. For a point source illumination on the back surface 36, the resolution of the plated region 24 on the front will be on the order of the thickness (e.g., the front to back dimension). Thus, for maximum resolution front surface point source illumination is preferred.

The same back illumination technique can be used for a thicker composite workpiece 14' as illustrated in FIG. 2. In this case it is desirable to have a strongly absorbing surface 16' which typically could be a metal and a substrate 17' which is transparent to the radiation.

The beam 22 emitted from the energy source 18 may be modulated by a modulator 26 which may (only if desired) be placed between the energy source 18 and the lens system 20, or alternatively between the lens system 20 and the workpiece 14. The modulator 26 may be a mechanical light chopper when the modulation rate is low or an optical modulator can be employed when more rapid modulation is sought. Optical modulation will allow frequencies up to the gigahertz range.

Preferential plating will occur in the region 24 heated by the impinging light. For a finite thermally conducting surface 16, modulating or pulsing of the light provides sharper temperature profiles in the vicinity of the light exposed region 24, enhances the plating rate, and improves edge definition.

Modulation of the laser light has the effect of limiting the thermal spread which occurs in the substrate through thermal conduction. Such thermal spread leads to a decrease in the plated pattern resolution.

While all modes of the present invention have been described in terms of a single beam 22 impinging on the workpiece 14 one could employ multiple beams and simultaneously plate at multiple locations.

Figure 3:
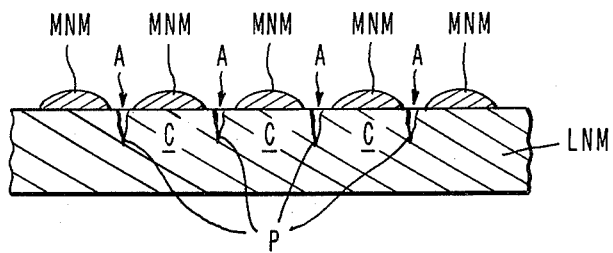
FIG. 3 shows a metallic substrate employing the prior art method of immersion or exchange plating.

FIG. 3 shows a typical prior art form of exchange plating process with a less noble metal substrate LNM contained in a bath (not shown) consisting of a more noble metal which forms deposits MNM on the less noble metal in cathodic regions C. Adjacent to the cathodic regions are pinholes P formed from intergranular regions or grain boundaries GB at which anodic regions are formed in the exchange plating bath. As a result, some of the less noble metal is dissolved from the intergranular regions and goes into the plating solution in ionic form.

Figure 4:
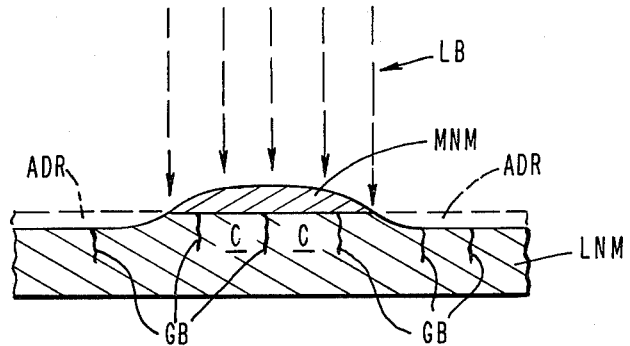
FIG. 4 shows a metallic substrate being plated by employing the energy beam, enhanced plating method of the instant invention.

FIG. 4 shows a laser enhanced exchange process in accordance with the instant invention. In this case a similar less noble metal substrate LNM is placed in an exchange plating bath, (or the equivalent bath) which will exhibit plating in accordance with the instant invention in the presence of an energy beam such as a laser beam LB. Where the laser beam LB hits the substrate, there is a thick plating of more noble metal MNM from the bath upon the substrate. Along the periphery of the plated area, there is simultaneous etching of the less noble metal LNM in the anodic dissolution region ADR. Note that the plating occurs across all of the formerly designated anodic areas A and cathodic areas C which are under the laser beam LB crossing over grain boundaries GB.

Figure 5:
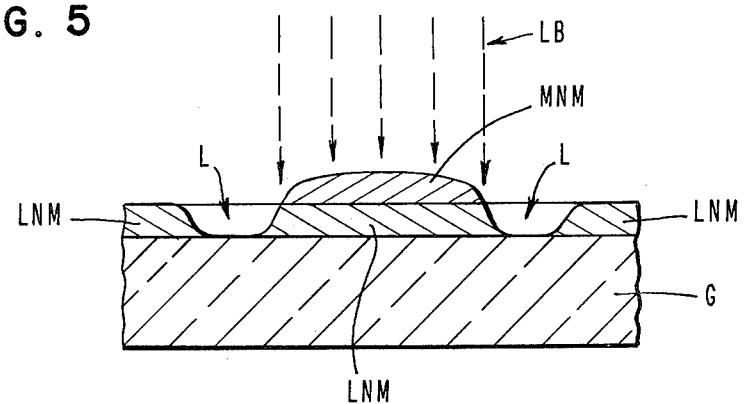
FIG. 5 shows a glass substrate carrying a thin metallic film being plated where a laser beam is incident on the film and is simultaneously etched about the periphery of the area being plated.

In FIG. 5, there is shown laser enhanced line formation. The substrate comprises glass substrate G covered with a thin film of a less noble metal LNM. The laser beam LB is directed upon a portion of the film LNM as shown in FIG. 5. The more noble metal MNM deposits under the beam as shown. On either side of the path scanned by the laser beam LB, an etched region in the form of a line L of the glass surface G is exposed circumscribing and isolating the section plated with more noble metal MNM from the remaining unplated sections of the less noble metal LNM. The line L is etched by the peripheral etching process described above which occurs simultaneously with the plating of film MNM. As a result, the surface plated with film MNM is electrically isolated along line L from the surrounding area of the less noble metal film LNM which remains unplated. Subsequent to completion of line L about the plated island MNM, plating then ceases, since the glass is an insulator, and charge conservation cannot be maintained.

TABLE I lists the variety of metals which have been locally exchange plated using the thermobattery effect on a sacrificial metal surface.

TABLE I

Laser Enhanced Exchange Plating Demonstrated For:
 Copper* on Nickel
 Copper on Tungsten
 Copper on Chrome
 Copper on Copper
 Gold** on Nickel
 Gold on Copper
 Gold on Tungsten

*Copper plated out of acidic copper sulfate solution
**Gold plated out of "Oromerse" exchange plating solution supplied by Technic Corporation of Cranston, R.I.

Figure 6:
FIG. 6 shows a photograph of the result of exchange plating, in accordance with invention, of copper on a 1500 angstrom thick film of nickel predeposited upon a glass substrate.
Figure 7:
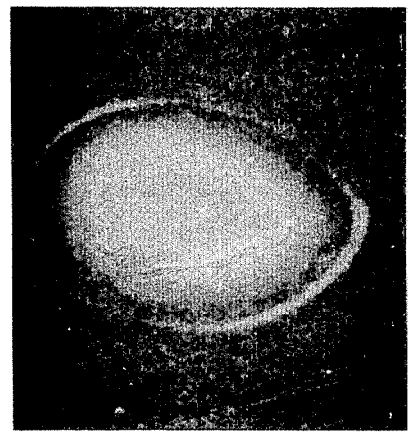
FIG. 7 shows a scanning electron micrograph (SEM) of a gold film plated, in accordance with this invention, onto a 1500 angstrom thick layer of Ti/Cr predeposited on glass.
Figure 8:
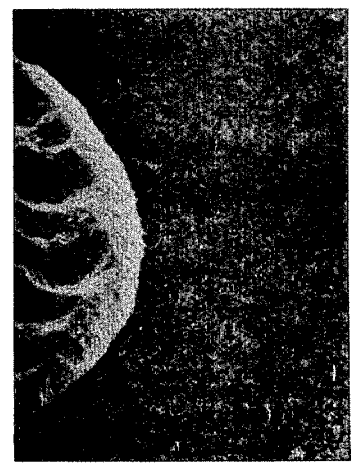
FIG. 8 shows an SEM of a fragment of a laser exchange plated copper deposited, in accordance with this invention, onto a copper substrate. The copper semicircular deposition pattern is surrounded by an etched halo region.

In general for an insulating substrate carrying a thin metallic film of a less noble metal as described above, the laser enhanced exchange plating continues until the peripheral electrode region is totally etched, thereby breaking contact between the region that is being plated and the region which maintains overall charge neutrality through etching. This simultaneous plating and etching is novel. Patterns electrically isolated from the surrounding metallization can be created. Examples of copper and gold laser enhanced exchange plating are shown in FIGS. 6 and 7. FIG. 6 shows the isolation band about an MNM island very clearly. The micrograph for gold FIG. 7 shows especially fine grain size in the central region of the laser enhanced plating. FIG. 8 shows a similar pattern resulting for $Cu/Cu^{++}$. This is a special case since there is no difference in nobility between the metals of the substrate and the electrolyte.

The non-noble metal can be chosen from the group, Ni, Cr, Ti, W, Fe, Co, Cu, Al and their alloys, etc. which are known as good adhesion metals to glasses and ceramics. Thus the present invention is particularly applicable to the plating of these dielectrics. This same process is applicable for enhanced localized exchange reactions on semiconductors.

EXAMPLES

EXAMPLE I

A titanium film approximately 100 A thick and a copper film about 1000 A thick are vapor deposited onto 0.3 mm thick glass substrates. The composite structures are used as workpieces. The copper plated surfaces are immersed in an Oromerse commercial gold immersion plating aqueous solution. The Oromerse was diluted 1:8 with water.

A continuous beam from an argon laser, tuned to 5145 A, is passed through the solution and illuminates regions of the surface of the titanium films. The beam locally heats the regions to be plated. The beam's spot size is approximately 100 micrometers and has a power density of $1 \times 10^3$ W/cm$^2$. Gold deposits to a thickness on the order of a micrometer as shown in FIG. 6. The gold plated region is isolated from the surrounding Ti/Cu films by simultaneous peripheral etching.

EXAMPLE II

Nickel films approximately 200 A–1000 A thick were vapor deposited onto 0.3 mm thick glass substrates, used as workpieces. The nickel surfaces were contacted with copper sulfate aqueous plating solutions (0.05 molar $CuSo_4$ in $H_2O$ pH about 3).

The beam was approximately the same as in EXAMPLE I.

Thicknesses of 0.33 to 2 micrometers were achieved for beam exposures from ⅛ to 5 sec. with widths from 150 to 250 micrometers for some thirty experiments resulting in lines and spots, with sharp edge definition and peripheral etching.

EXAMPLE III

Gold has been deposited upon bulk copper using Oromerse as in EXAMPLE I. The laser power density was about $10^5$ watts/cm$^2$. Spots and lines were plated with line widths of 50–100 micrometers and thicknesses of from 1–2 micrometers. Spots on the order of 100 micrometers in diameter up to 50 micrometers in thickness have also been achieved. Otherwise conditions shown in EXAMPLE I were used.

EXAMPLE IV

Similar gold plating results have been achieved where nickel plating of about 1 micrometer has been plated onto bulk copper 0.5 mm thick. The power density was similar to that in EXAMPLE III. Otherwise conditions employed in EXAMPLE I were used.

EXAMPLE V

Tungsten was predeposited to 900 A thickness onto glass. The sample was placed in Oromerse diluted 1:8 in $H_2O$. The beam was scanned manually back and forth to plate a line. The beam was as in EXAMPLE I. Gold lines on the order of 0.5 micrometer in thickness were achieved.

Industrial Applicability

The plating method of this invention is well suited to applications such as localized gold plating onto bulk samples such as electronic connectors, repairing integrated circuits, placing lines on gas display panels and the production of transmission lines on substrates. In view of these applications, the technique should find use in the electronic packaging and related industries.

The technique will also allow one to plate preferentially in selected regions locally increasing the thickness in regions where it might be desired to change the mechanical properties (i.e., increase wear resistance). This capability of the method should be of general use to the plating industry and of particular interest for the plating onto plastic and other dielectric substrates.

While the novel features of this invention have been described in terms of preferred embodiments and for particular industrial applications it will be understood that the various omissions and substitutions in the form and details in the method described may be made by those skilled in the art without departing from the spirit of the invention.

This processes has many different uses in the electronics industry, i.e. line repair, circuit delineation, local activation of surfaces for deposition, etc.

Having thus described our invention, what we claim as new, and desire to secure by Letters Patent is:

1. A method for selectively plating onto a surface of a workpiece without application of an electrical potential source comprising the steps of:
   contacting said surface with a plating solution in the absence of a reducing agent and without application of an electrical potential source, and
   directing an energy beam onto the workpiece to locally heat the surface to promote plating.

2. The method of claim 1 wherein said beam is laser generated said beam having an intensity between about $10^2$ W/cm$^2$ and $10^6$ W/cm$^2$.

3. The method of claim 2 wherein said beam is modulated.

4. The method of claim 3 wherein said workpiece is a composite structure having a thermally insulating substrate and a film which is strongly absorbent of the energy of said beam.

5. The method of claim 4 wherein said substrate is transparent to the beam which passes through said substrate and impinges on an interface between said substrate and said film.

6. A method for preferentially plating regions of a surface employing a non-photo decomposable plating solution without a reducing agent, the improvement comprising:
   directing a light beam onto the region of the surface to heat the surface locally where preferential plating is sought, said beam having an intensity of at least $10^2$ W/cm$^2$.

7. A method in accordance with claim 1, 2, 3, 4, 5, or 6, wherein plating into through and via holes, and onto corners, and edges in a workpiece are achieved.

8. A method in accordance with claim 1, 2, 3, 4, 5, or 6, wherein simultaneous plating onto areas heated by said energy beam and etching along the periphery of said areas heated by said energy beam is provided.

9. A method in accordance with claim 1, 2, 3, 4, 5, or 6, wherein simultaneous plating onto areas heated by said energy beam and etching along the periphery of said areas heated by said energy beam is provided to produce isolated patterns and electrical circuits.

* * * * *